United States Patent [19]

Kurata et al.

[11] 3,780,317

[45] Dec. 18, 1973

[54] TRANSISTORIZED COMPARATOR CIRCUIT

[75] Inventors: Takao Kurata; Atsushi Oritani, both of Kobe-shi, Japan

[73] Assignee: Fujitsu Limited, Kawasaki, Japan

[22] Filed: July 29, 1971

[21] Appl. No.: 167,125

[30] Foreign Application Priority Data

July 31, 1970 Japan .............................. 45/67184

[52] U.S. Cl. ............ 307/235 R, 307/218, 307/237, 307/268, 307/280, 307/300

[51] Int. Cl. ..... H03k 5/20, H03k 5/08, H03k 19/30

[58] Field of Search .................. 307/235, 215, 280, 307/268, 300; 330/30 D, 30 R, 32

[56] References Cited

UNITED STATES PATENTS

| | | | |
|---|---|---|---|
| 3,508,076 | 4/1970 | Winder | 307/235 |
| 2,887,542 | 5/1959 | Blair et al. | 307/200 X |
| 3,469,112 | 9/1969 | Hands et al. | 307/235 X |
| 3,512,016 | 5/1970 | Huang et al. | 307/300 |
| 3,534,281 | 10/1970 | Hillhouse | 307/300 X |
| 3,237,022 | 2/1966 | Myers, Jr. | 307/280 X |
| 3,317,850 | 5/1967 | Hilbiber | 330/30 R |
| 3,359,430 | 12/1967 | Jones | 307/280 X |
| 3,386,081 | 5/1968 | Varsos | 307/235 X |
| 3,449,687 | 6/1969 | Knauber et al. | 330/30 D |
| 3,519,849 | 7/1970 | Tyler | 307/235 |
| 13,609,398 | 9/1971 | Kronlage | 307/300 X |

OTHER PUBLICATIONS

Hunter, "Handbook of Semiconductor Electronics," pp. 1–5 to 1–7; McGraw-Hill Book Co, 3rd Edition, 1970.

Millman & Halkias, "Electronic Devices and Circuits," pp. 400–403, 705; McGraw-Hill Book Co. 1967.

Gosling, Field Effect Transistor Applications, pp. 27–30, 41, 47–78; John Wiley & Sons, 1965.

*Primary Examiner*—John W. Huckert
*Assistant Examiner*—L. N. Anagnos
*Attorney*—Curt M. Avery et al.

[57] ABSTRACT

A comparator circuit comprises a differential amplifier for providing the difference between signals supplied to its inputs. An amplifier and pulse shaper has a transistor connected to the differential amplifier for amplifying and shaping the output signal of the differential amplifier. An impedance converter connected to the output of the amplifier and pulse shaper transistor transmits output signals at low output impedance. A negative feedback path is provided between the output of the impedance converter and the input of the amplifier and pulse shaper transistor. The negative feedback path is operational when the voltage between its input and output is substantially zero and is non-operational when the voltage between its input and output is different from zero.

8 Claims, 6 Drawing Figures

TRANSISTORIZED COMPARATOR CIRCUIT

The invention relates to a transistorized comparator circuit. More particularly, the invention relates to a comparator circuit for which integrated circuits are particularly suitable.

A voltage comparator circuit is utilized for analog to digital conversion, the shaping of noise superposing pulses and pulse height distribution measurement of the output pulse of a nuclear radiation detector. This type of comparator circuit is provided with a pair of input terminals. A fixed reference voltage is maintained at one of the terminals. Input signals of the aforedescribed pulses are supplied to the other terminal. The comparator circuit produces no output until the level of the input signal reaches that of the reference voltage. An output signal is produced as soon as the input voltage reaches the level of the reference voltage.

There is no need for the output to have the waveform of the input signal. The output signal may thus be a square pulse, for example, not related in any way to the input pulse. Normally, the input stage of this type of comparator circuit is differential amplifier having a pair of input terminals. The output from the differential amplifier stage is amplified, shaped in the next stage, and converted to a square pulse. The pulse is then passed through the emitter follower on the side of the impedance conversion circuit and transmitted to the outside circuits at a low impedance.

In a conventional transistorized voltage comparator circuit, the amplifying and shaping transistor is saturated for efficient use when it receives a signal. The amplifying and shaping transistor is designed to be cut off rapidly when signals are received. In such a transistor, the increase of the output signal is delayed due to the minority carrier storage effect therein. This causes a delay between the input and output signals. That is, the propagation delay time increases. In order to reduce the carrier storage effect, the conventional transistor is doped with gold in order to decrease the life of the transistor. The doping with gold results in the reduction of the minority carrier storage effect to a certain extent. However, one of the disadvantages of such doping is that it creates crystal defects in the transistor. Furthermore, it deteriorates the frequency characteristics of the transistor. The gold doping process is additionally required if the comparator circuit is to be integrated. Since the gold diffuses with considerable rapidity in a semiconductor body, it is difficult to control the doping rate of the gold.

An object of our invention is to provide a comparator circuit which overcomes the disadvantages of the known comparator circuits.

An object of our invention is to provide a transistorized comparator circuit which overcomes the disadvantages of known transistorized comparator circuits.

Another object of the invention is to provide a transistorized comparator circuit having a reduced signal propagation delay time.

Still another object of our invention is to provide a comparator circuit which eliminates the need for a gold doping process.

Another object of the invention is to provide a high speed comparator circuit.

An additional object of our invention is to provide a comparator circuit which may be utilized in an integrated circuit without the need for a gold doping process.

An object of the invention is to provide a comparator circuit having an amplifier and pulse shaper transistor which is continuously maintained in its non-saturated condition.

An object of the invention is to provide a comparator circuit having an amplifier and pulse shaper transistor which is prevented from reaching saturation by a negative feedback through a pn junction semiconductor device.

Still another object of our invention is to provide a comparator circuit in which the propagation delay time of the signal and the rise time of the pulse are very short.

In accordance with the invention, a comparator circuit comprises a differential amplifier having a pair of inputs and an output for providing the difference between signals supplied to its inputs. Input means supplies input signals to the inputs of the differential amplifier. An amplifier and pulse shaper comprises an amplifier and pulse shaper transistor having an input connected to the output of the differential amplifier and an output. An impedance converter has an input connected to the output of the amplifier and pulse shaper transistor and an output for transmitting output signals of the amplifier and pulse shaper transistor at low output impedance. Output means at the output of the impedance converter provides output signals at low output impedance. A negative feedback path is provided between the output of the impedance converter and the input of the amplifier and pulse shaper transistor. The negative feedback path is operational when the voltage between its input and output is substantially zero and is non-operational when the voltage between its input and output is different from zero.

The differential amplifier may comprise bipolar transistor amplifier elements or field effect transistor amplifier elements.

The negative feedback path may include a semiconductor component having a pn junction, a semiconductor junction diode, or a semiconductor point contact diode.

The negative feedback path may include a semiconductor bipolar transistor having emitter, base and collector electrodes and means for varying the base-emitter voltage to control the emitter-collector conductivity.

The impedance converter may comprise a bipolar transistor in emitter follower connection, a field effect transistor in grounded chain connection, or a field effect transistor and a bipolar transistor.

The output means is close to ground potential when the input signal is zero. The difference between the potential at the output means and ground potential is constant when the input signal is zero.

In accordance with the invention, in the comparator circuit of the invention, saturation of the amplifier and pulse shaper transistor is prevented by a negative feedback through a semiconductor device having a *pn* junction. If the transistor exceeds the saturation level, the negative feedback path becomes conductive and prevents the saturation. This prevents the minority carrier storage effect which would result from saturation of the transistor. Furthermore, the potential at the output terminal when there is no input signal is stabilized by the negative feedback. When the amplifier and pulse shaper transistor comes close to its cutoff or non-conductive condition due to the input signal, the feedback semiconductor device having a *pn* junction is also cut off or switched to its non-conductive condition. The feedback path is also cut off or made inoperative, so that the amplifier and pulse shaper transistor is switched to its cutoff or non-conductive condition.

In order that the invention may be readily carried into effect, it will now be described with reference to the accompanying drawings, wherein.

In the FIGS., the same components are identified by the same reference numerals.

Figure 1:
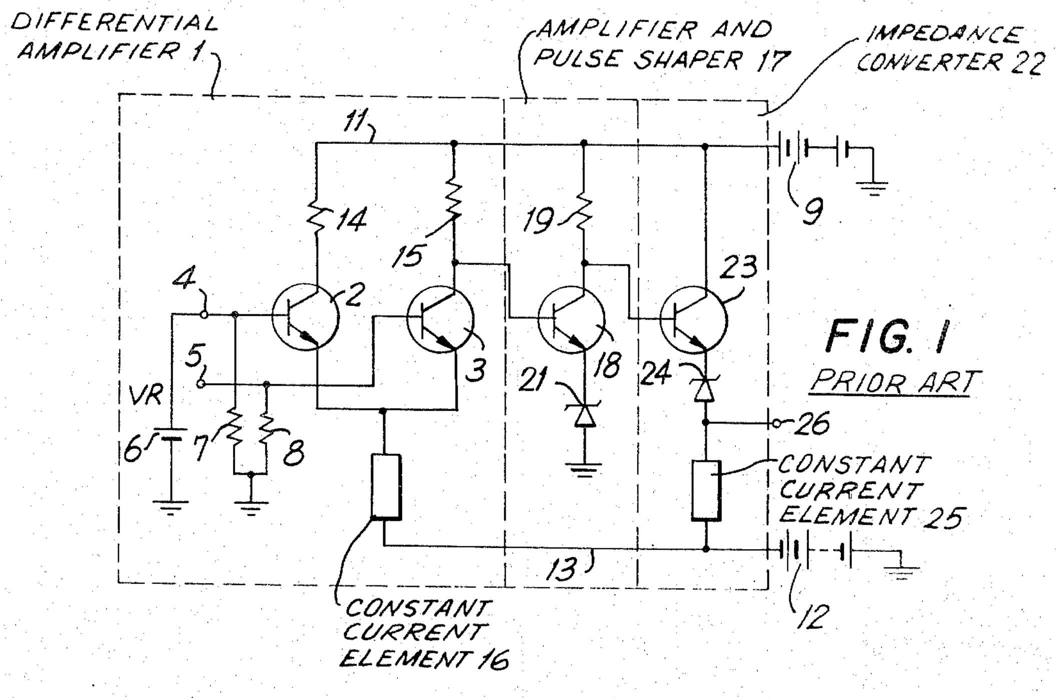
FIG. 1 PRIOR ART
FIG. 1 is a circuit diagram of a known transistorized voltage comparator circuit.

In FIG. 1, a differential amplifier 1 comprises a first transistor 2 and a second transistor 3. A first input terminal 4 is connected directly to the base electrode of the transistor 2. A second input terminal 5 is directly connected to the base electrode of the transistor 3. The difference between the signals supplied to the input terminals 4 and 5 is detected in the collector electrodes of the transistors 2 and 3. A source of voltage 6 is connected between the input terminal 4 and a point at ground potential. The voltage source 6 provides a reference potential VR and applies said potential to the first input terminal 4. The reference potential VR is a positive potential. The base electrode of the transistor 2 is connected to a point at ground potential via a resistor 7. The base electrode of the transistor 3 is connected to a point at ground potential via a resistor 8.

A source of voltage 9 has its negative polarity terminal connected to a point at ground potential and its positive polarity terminal connected to a positive potential lead 11. A source of voltage 12 has its positive polarity terminal connected to a point at ground potential and its negative polarity terminal connected to a negative lead 13. The collector electrode of the transistor 2 is connected to the positive lead 11 via a resistor 14 and the collector electrode of the transistor 3 is connected to said positive lead via a resistor 15. The emitter electrodes of the transistors 2 and 3 are connected to each other and are connected in common to the negative lead 13 via a constant current element 16.

The constant current element connected to the emitter electrodes of the first and second transistors 2 and 3 ensures satisfactory operation of the differential amplifier. The constant current element 16 may comprise the collector-emitter path of a transistor having a grounded base electrode.

If a positive pulse having noise superimposed thereon is supplied to the second input terminal 5, only that part of the input signal waveform which exceeds the reference voltage VR is amplified and provided at the collector electrode of the transistor 3. The polarity of the waveform is opposite that of the input signal after amplification.

An amplifier and pulse shaper 17 is connected to the output of the differential amplifier 1. The amplifier and pulse shaper comprises a third transistor 18. The base electrode of the transistor 18 is directly connected to the collector electrode of the transistor 3. The collector electrode of the transistor 18 is connected to the positive lead 11 via a resistor 19. The emitter electrode of the transistor 18 is connected to a point at ground potential via a Zener diode 21.

The output signal of the transistor 3 of the differential amplifier 1 is further amplified by the transistor 18 of the amplifier and pulse shaper 17. If the grain from the input terminal 5 to the collector electrode of the transistor 18 is sufficiently high, the transistor 18 is switched to its cutoff or non-conductive condition immediately. This condition is maintained until approximately the point of decrease of the input pulse. The output waveform of the transistor 18 is therefore almost a square in configuration.

An impedance converter 22 is connected to the output of the amplifier and pulse shaper 17. The impedance converter 22 comprises a fourth transistor 23. The base electrode of the transistor 23 is directly connected to the collector electrode of the transistor 18. The collector electrode of the transistor 23 is directly connected to the positive lead 11. The emitter electrode of the transistor 23 is connected to the negative lead 13 via the series circuit connection of a second Zener diode 24 and a second constant current element 25. An output terminal 26 is connected to a common point in the connection between the Zener diode 24 and the second constant current element 25.

The impedance converter 22 functions to amplify and transmit the output signal of the transistor 18 of the amplifier and pulse shaper 17 at a low output impedance to outside circuits via the output terminal 26. The constant current element 25 is connected as an emitter load in the emitter follower circuit of the impedance converter 22. The Zener diode 24 functions to equalize the voltage of the output terminal 26 to that of ground potential when there is no signal. The function of the voltage source 12 is to provide the required negative bias for the first and second constant current elements 16 and 25. Since the transistor 18 of the amplifier and pulse shaper 17 is utilized for amplification and shaping and is saturated when there is no signal, the output signal is delayed due to the storage of minority carriers. It is desirable that such delay time be reduced to a minimum in order to provide high speed operation of the circuit.

Figure 2:
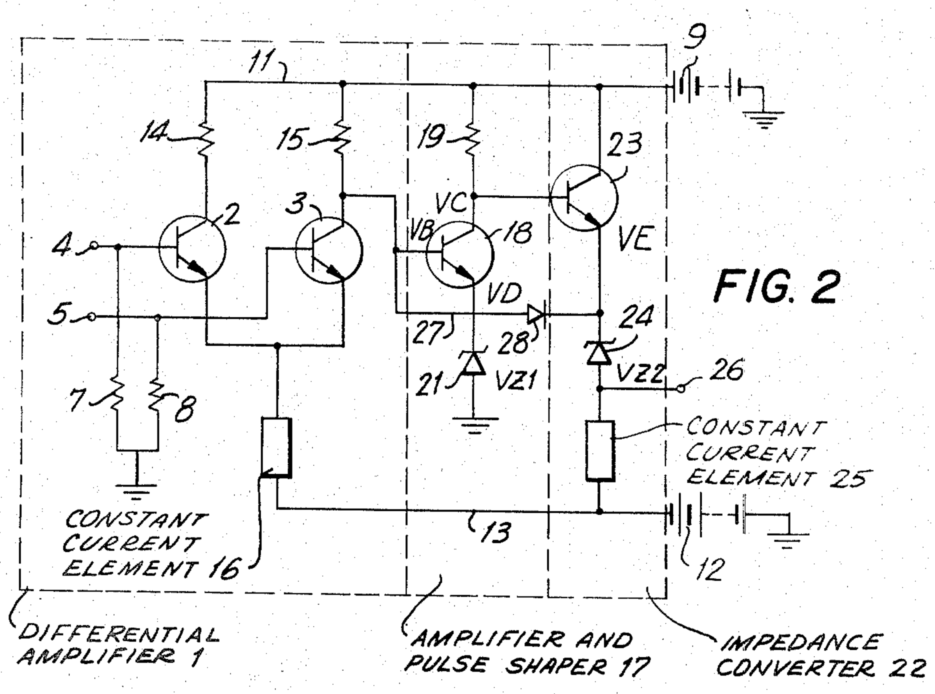
FIG. 2 is a circuit diagram of an embodiment of the transistorized voltage comparator circuit of the invention utilizing negative feedback applied via a diode.

FIG. 2 illustrates a first embodiment of the comparator circuit of the invention. The circuit of FIG. 2 is identical to that of FIG. 1, with the exceptions that there is no source of reference potential connected to the input terminal 4 and a negative feedback circuit 27 comprising a diode 28 is connected between the emitter electrode of the transistor 23 of the impedance converter 22 and the base electrode of the transistor 18 of the amplifier and pulse shaper 17. The anode of the diode 28 is directly connected to the base electrode of the transistor 18 and the cathode of said diode is directly connected to the emitter electrode of the transistor 23.

The diode 28 prevents the saturation of the transistor 18 of the amplifier and pulse shaper 17 and assists in stabilizing the potential at the output terminal 26.

It is assumed that the transistor 18 of the amplifier and pulse shaper 17 of FIG. 2 is saturated. The collector potential of the transistor 18 is therefore almost equal to its emitter potential. If it is assumed that the voltage at the first Zener diode 21 is VZ1, the collector voltage of the transistor 18 will be approximately VZ1. Since the collector electrode of the transistor 18 is connected to the base electrode of the transistor 23, which transistor 23 is connected in emitter follower arrangement, the potential of the emitter electrode of the transistor 23 is approximately VZ1 − VBE23.

The voltage VBE23 is the voltage between the base and emitter electrodes of the transistor 23. The base potential of the transistor 18 is VZ1 + VBE18. The voltage VBE18 is the voltage between the base and emitter electrodes of the transistor 18. The voltage between the anode and cathode of the diode 28 is approximately $$VZ1 + VBE18 - (VZ1 - VBE23) = VBE18 + VBE23$$

Since the voltage between the electrodes of the diode 28 is considerably greater than the forward voltage of the *pn* junction, a large current flows through said diode. Actually, however, the large current flow does not occur.

The current in the diode 28 flows via the collector load resistor 15 of the transistor 3 of the differential amplifier 1. Therefore, when the diode current is large, the base potential of the transistor 18 is considerably decreased. On the other hand, the emitter potential of the transistor 23 is increased. Therefore, the voltage between the electrodes of the diode 28 is decreased and the current in said diode is finally limited. This indicates that the collector potential of the amplifier and pulse shaper 17 does not come close to the emitter potential. There must be a balance before the transistor 18 reaches the saturation level.

The potential at various points of FIG. 2 in the balance condition is as follows. It is assumed that the voltage between the electrodes of the diode 28 is VD and that the base voltage and collector voltage of the transistor 18 are VB and VC, respectively. Since the collector electrode of the transistor 18 is connected to the base electrode of the transistor 23, $$VD = VB - (VC - VBE23)$$

Therefore, $$VC = VB + (VBE23 - VD)$$

Since the voltage VBE23 is approximately equal to the voltage VD, $$VBE23 - VD \approx 0$$

so that $$VC \approx VB$$

The voltage between the collector and base electrodes of the transistor 18 is thus nearly zero, and the collector junction cannot be forward biased. That is, the transistor 18 cannot be saturated.

If sufficient current is supplied to the transistor 23, $$VBE23 > VD$$

or $$VBE23 - VD > 0$$

This results in the transistor 18 being biased in the active region. It is clear from the foregoing explanation that the transistor 18 does not become saturated.

If it is assumed that when there is no signal, the potential at the output terminal 26 is VO, such potential may be expressed as $$VO = VE - VZ2 = (VZ1 + VBE18 - VD) - VZ2$$

The voltage VE is the emitter potential of the transistor 23 and the voltage VZ2 is the Zener voltage of the second Zener diode 24.

If VZ1 is made equal to VZ2, $$VO = VBE18 - VD$$

Since VBE18 and VD are almost equal, $VO \approx 0$. That is, the potential at the output terminal 26 is almost zero when there is no signal. In other words, the output terminal 26 is equal to ground potential when there is no signal. However, as long as the diode 28 is in its conductive condition, the potential at the output terminal 26 is stabilized, since there is a feedback from the output terminal to the base electrode of the transistor 18. If the output signal of the comparator circuit of FIG. 2 is utilized to drive a digital circuit, it is desirable that the potential at the output terminal 26 be almost equal to ground potential when there is no input signal, and it is desirable that such potential be sufficiently stable.

When a positive signal is supplied to the input terminal 5, the base electrode of the transistor 18 becomes negative and the emitter potential of the transistor 23 increases. As a result, the potential difference between the terminals of the diode 28 decreases. Finally, the diode 28 is cut off or switched to its non-conductive condition, and does not affect the operation of the circuit. Since this indicates that the negative feedback is removed, the gain of the circuit increases and the transistor 18 is switched to its cutoff or non-conductive condition. Thus, since the transistor 18 always operates in a non-saturated condition in the circuit of FIG. 2, there is no minority carrier storage effect. There is thus no need for gold doping of the transistor. This permits the utilization of a high cutoff frequency transistor and results in a considerable reduction of the rise time of the output pulse.

For convenience in explanation, the input signal was assumed to be a voltage. However, since the transistor operates by input current, the comparator circuit of FIG. 2 may sometimes be utilized to compare the input current with a reference current. If, however, the first transistor 2 of the differential amplifier 1 is a field effect transistor, the comparator circuit responds to an input voltage.

Figure 3:
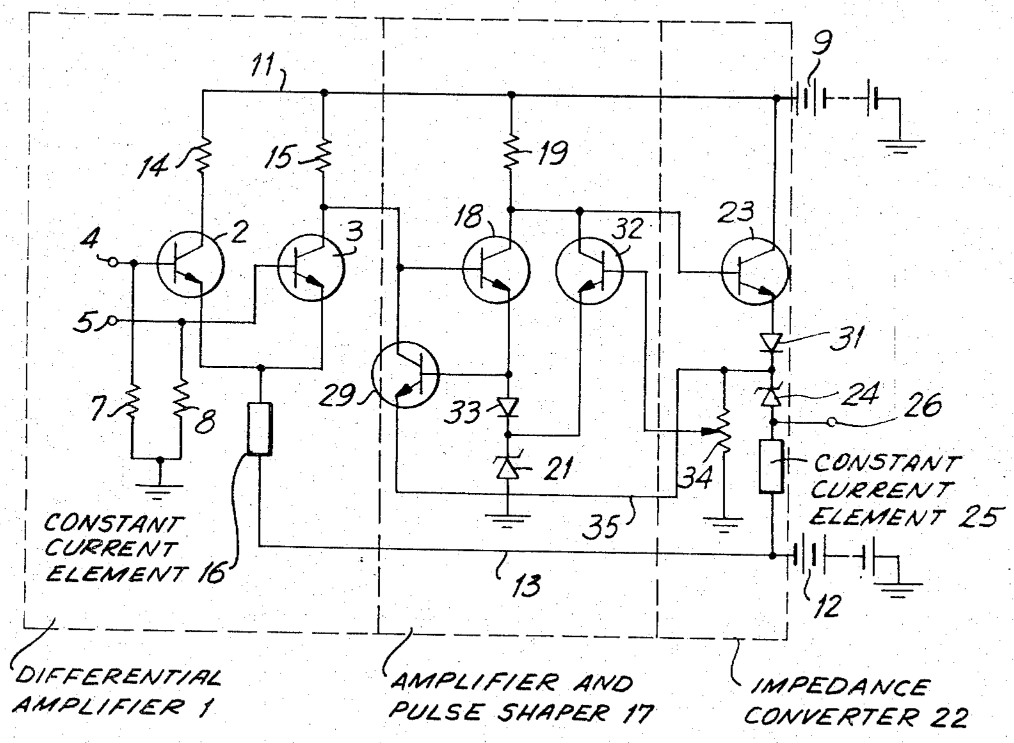
FIG. 3 is a circuit diagram of another embodiment of the transistorized voltage comparator circuit of the invention utilizing negative feedback applied via a transistor.

FIG. 3 illustrates the second embodiment of the comparator circuit of the invention. In the embodiment of FIG. 3, a fifth transistor 29 is utilized as the negative feedback. The collector electrode of the transistor 29 is connected to the collector electrode of the transistor 3 and the base electrode of the transistor 18. The base electrode of the transistor 29 is connected to the emitter electrode of the transistor 18. A diode 31 is connected in series circuit arrangement with the second Zener diode 24 and the second constant current element 25 between the emitter electrode of the transistor 23 and the negative potential lead 13. The emitter electrode of the transistor 29 is connected to a common point in the connection between the diode 31 and the Zener diode 24.

A sixth transistor 32 is included in the circuit of FIG. 3. A second diode 33 is connected in series circuit arrangement with the first Zener diode 21 between the emitter electrode of the transistor 18 and a point at ground potential. The emitter electrode of the transistor 32 is connected to a common point in the connection between the diode 33 and the Zener diode 21. The collector electrode of the transistor 32 is connected to the collector electrode of the transistor 18 and the base electrode of the transistor 23. A variable resistor 34 is connected between a lead 35 which connects the emitter electrode of feedback transistor 29 to the common point in the connection between the diode 31 and the Zener diode 24 and a point at ground potential. The base electrode of the sixth transistor 32 is connected to the variable or movable electrode or tap contact of the variable resistor 34. The variable resistor 34 functions to adjust the base bias voltage of the transistor 32.

The diode 31 connected to the transistor 23 of the impedance converter 22 provides a bias for the emitter electrode of the feedback transistor 29. The base potential of the feedback transistor 29 is thus always constant regardless of whether or not there is a signal. If the transistor 18 is then saturated, its collector potential will be slightly greater than its emitter potential. Thus, since the emitter electrode of the feedback transistor 29 is connected to the emitter electrode of the transistor 23, the transistor 18 is saturated and there is a possibility that said feedback transistor will not reach its conductive condition.

In order to eliminate the aforedescribed disadvantage, the diode 31 is connected between the emitter electrode of the transistor 23 and the second Zener diode 24 and the emitter electrode of the feedback transistor 29 is connected to the common point in the connection between said diode and said Zener diode. This connection causes the emitter potential of the feedback transistor 29 to decrease by a magnitude equal to the positive voltage and said feedback transistor is switched to its conductive condition before the transistor 18 reaches saturation. The saturation of the transistor 18 is thus prevented.

When the emitter potential of the transistor 23 reaches a high magnitude, because the emitter potential of the transistor 18 is at a correspondingly high magnitude, the diode 33 is connected to the emitter electrode of the transistor 18.

The function of the sixth transistor 32 is to reduce the fluctuations in the amplitude of the output pulse caused by fluctuations of the power supply. The collector electrode of the pulse amplitude setting transistor 32 is connected to the collector electrode of the transistor 18 and its emitter electrode is connected to the cathode of the Zener diode 21, as hereinbefore described. The emitter potential of the pulse amplitude setting transistor 32 is stabilized by the first Zener diode 21. The transistor 32 may be kept in its cutoff or non-conductive condition, by adjustment of the variable resistor 34. If the amplitude of the output pulse exceeds a specific limit when there is a signal, the pulse amplitude setting transistor 32 is switched to its conductive condition. The collector current of said transistor flows through the resistor 19. The collector potential of the transistor 32 then decreases considerably.

When the collector potential of the pulse amplitude setting transistor 32 decreases considerably, the emitter potential of the transistor 23 also decreases. As a result, the amplitude of the output pulses is maintained constant regardless of voltage fluctuations in the positive power supply 9. The amplitude of the output pulses may be adjusted within a specified limit by adjustment of the variable resistor 34. The transistor 18 of the comparator circuit of the invention is always operated in its non-saturated condition. The feedback circuit utilized to prevent saturation of the transistor 18 is cut off when an output pulse with a very short rise time is provided due to the input signal. Experimentally, we have obtained an output pulse with a rise time of approximately 10 microseconds. There is no need for gold doping of the transistor utilized in the comparator circuit of the invention, so that when the circuit of the invention is utilized in an integrated circuit, there is no need for a doping process.

The comparator circuit of the invention permits the output terminal voltage to be maintained equal to ground potential, due to the feedback, when there is no signal. In FIG. 3, especially, when a circuit for preventing fluctuations in the amplitude of the output pulses is provided, the fluctuations in the amplitude of the output pulses due to power supply voltage fluctuations may be avoided. The base level of the output pulse is always close to zero volts. In addition, a steady pulse output of wave amplitude may also be provided. Furthermore, the comparator circuit of the invention is ideally suited for driving digital circuits.

Figure 4:
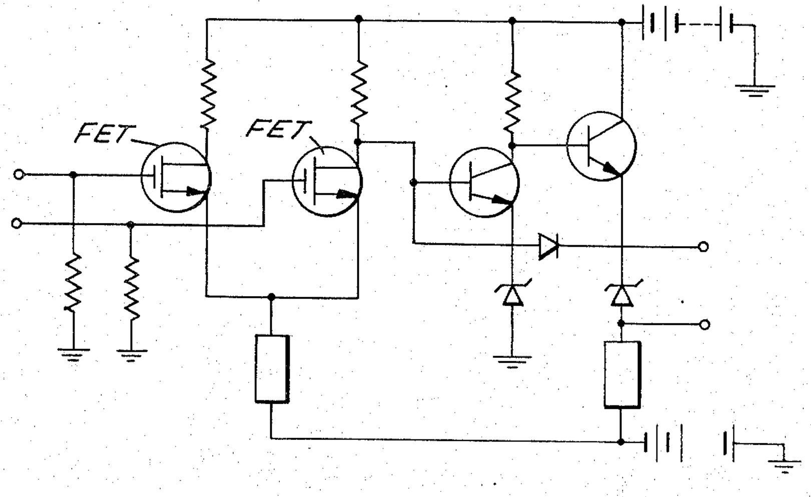
FIG. 4 is a circuit diagram of a modification of the differential amplifier of the voltage comparator circuit of the invention.

FIG. 4 illustrates a modification of the differential amplifier of the voltage comparator circuit of the invention in which the amplifier elements comprise field effect transistors or FETs.

Figure 5:
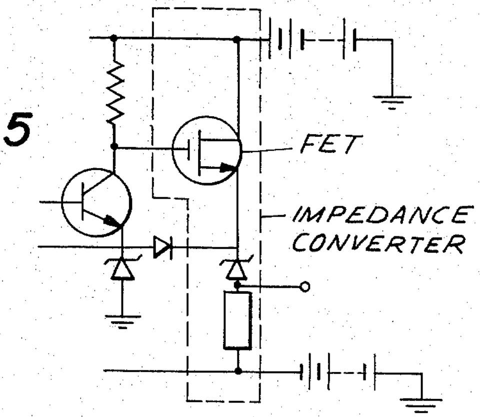
FIG. 5 is a circuit diagram of a modification of the impedance converter of the voltage comparator circuit of the invention.

FIG. 5 illustrates a modification of the impedance converter of the voltage comparator circuit of the invention in which said impedance converter comprises a field effect transistor or FET in grounded drain connection.

Figure 6:
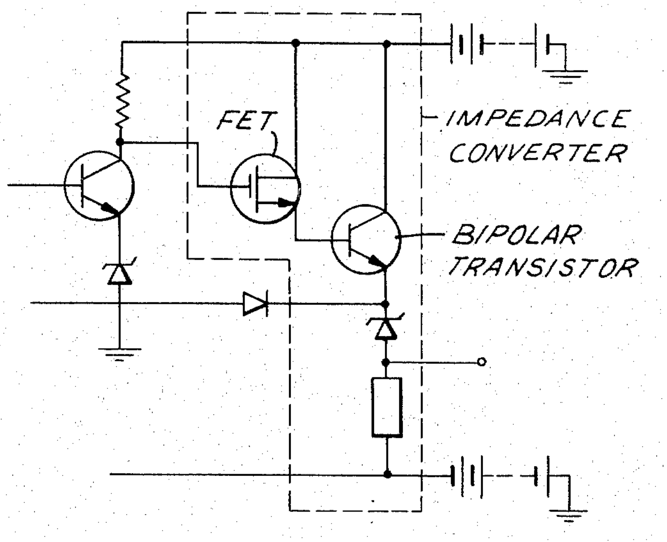
FIG. 6 is a circuit diagram of another modification of the impedance converter of the voltage comparator circuit of the invention.

FIG. 6 illustrates another modification of the impedance converter of the voltage comparator circuit of the invention in which said impedance converter comprises a field effect transistor or FET and a bipolar transistor.

While the invention has been described by means of specific examples and in specific embodiments, we do not wish to be limited thereto, for obvious modifications will occur to those skilled in the art without departing from the spirit and scope of the invention.

We claim:

1. A comparator circuit comprising a differential amplifier having a pair of inputs and an output for providing the difference between signals supplied to its inputs; input means for supplying input signals to the inputs of the differential amplifier; an amplifier and pulse shaper comprising an amplifier and pulse shaper transistor having an input connected to the output of the differential amplifier and an output; an impedance converter having an input connected to the output of the amplifier and pulse shaper transistor and an output for transmitting output signals of the amplifier and pulse shaper transistor at low output impedance; output means at the output of the impedance converter for providing output signals at low output impedance; and a negative feedback path between the output of the impedance converter and the input of the amplifier and pulse shaper transistor, said negative feedback path being operational when the voltage between its input and output is substantially zero and being non-operational when the voltage between its input and output is different from zero, the impedance converter having an emitter circuit, the pulse shaper transistor having emitter and base electrodes, and the negative feedback path including a semiconductor bipolar transistor having a base electrode connected to the emitter electrode of the pulse shaper transistor, an emitter electrode connected to the emitter circuit of the impedance converter and a collector electrode connected to the base electrode of the pulse shaper transistor and means for varying the base-emitter voltage to control the emitter-collector conductivity.

2. A comparator circuit as claimed in claim 7, wherein the differential amplifier comprises bipolar transistor amplifier elements.

3. A comparator circuit as claimed in claim 7, wherein the differential amplifier comprises field effect transistor amplifier elements.

4. A comparator circuit as claimed in claim 1, wherein the impedance converter comprises a bipolar transistor in emitter follower connection.

5. A comparator circuit as claimed in claim 1, wherein the impedance converter comprises a field effect transistor in grounded drain connection.

6. A comparator circuit as claimed in claim 1, wherein the impedance converter comprises a field effect transistor and a bipolar transistor.

7. A comparator circuit as claimed in claim 1, wherein the output means is close to ground potential when the input signal is zero.

8. A comparator circuit as claimed in claim 1, wherein the difference between the potential at the output means and ground potential is constant when the input signal is zero.

* * * * *